(12) United States Patent
Toda

(10) Patent No.: US 11,742,619 B2
(45) Date of Patent: Aug. 29, 2023

(54) CIRCUIT BOARD AND CABLE HARNESS PROVIDED WITH THE SAME

(71) Applicant: Japan Aviation Electronics Industry, Limited, Tokyo (JP)

(72) Inventor: Kentaro Toda, Tokyo (JP)

(73) Assignee: Japan Aviation Electronics Industry, Limited, Tokyo (JP)

(*) Notice: Subject to any disclaimer, the term of this patent is extended or adjusted under 35 U.S.C. 154(b) by 330 days.

(21) Appl. No.: 17/282,191

(22) PCT Filed: Oct. 25, 2019

(86) PCT No.: PCT/JP2019/041842
§ 371 (c)(1),
(2) Date: Apr. 1, 2021

(87) PCT Pub. No.: WO2020/116048
PCT Pub. Date: Jun. 11, 2020

(65) Prior Publication Data
US 2021/0344143 A1    Nov. 4, 2021

(30) Foreign Application Priority Data
Dec. 4, 2018  (JP) ................................. 2018-227513

(51) Int. Cl.
*H01R 13/6471*  (2011.01)
*H01P 3/08*  (2006.01)
(Continued)

(52) U.S. Cl.
CPC ........... *H01R 13/6471* (2013.01); *H01P 3/08* (2013.01); *H01R 12/724* (2013.01); *H01R 13/66* (2013.01); *H05K 1/11* (2013.01)

(58) Field of Classification Search
CPC ......... H01P 3/08; H01R 13/66; H01R 13/665; H01R 13/6691; H01R 13/6471;
(Continued)

(56) References Cited

U.S. PATENT DOCUMENTS 4,871,319 A * 10/1989 Babow ................... H01R 12/62
439/495
6,867,668 B1 * 3/2005 Dagostino ............... H01L 23/66
333/260

(Continued)

FOREIGN PATENT DOCUMENTS

| CN | 106450827 A * | 2/2017 | ........... B23K 1/0016 |
| JP | 2001-007458 A | 1/2001 | |

(Continued)

OTHER PUBLICATIONS

International Search Report in PCT/JP2019/041842, dated Dec. 24, 2019.

(Continued)

*Primary Examiner* — Marcus E Harcum
(74) *Attorney, Agent, or Firm* — Collard & Roe, P.C.

(57) ABSTRACT

In this circuit board 30, first signal wiring portions 351 and second ground wiring portions 353 of a first wiring layer 34 are adjacent to each other in a pitch direction. Further, second signal wiring portions 381 and first ground wiring portions 383 of a second wiring layer 37 are adjacent to each other in the pitch direction. In the pitch direction, outer edges 405 of line portions 345 of two first signal wiring portions 351 are located more inward than both edges 435 of a line portion 375 of the first ground wiring portions 383. Outer edges 415 of line portions 375 of two second wiring portions 381 are located more inward than both edges 425 of the line portion 345 of the second ground wiring portion 353. This achieves good signal transmission characteristics (Continued)

without providing a ground layer separate from a signal layer.

6 Claims, 17 Drawing Sheets

(51) Int. Cl.
*H01R 12/72* (2011.01)
*H01R 13/66* (2006.01)
*H05K 1/11* (2006.01)

(58) Field of Classification Search
CPC .. H01R 12/724; H01R 12/721; H01R 12/722; H01R 12/727; H05K 1/11; H05K 1/111; H05K 1/117; H05K 1/0298
USPC ........................................ 439/607.35, 607.36
See application file for complete search history.

(56) References Cited

U.S. PATENT DOCUMENTS

| | | | |
|---|---|---|---|
| 7,154,353 B2 | 12/2006 | Dohata | |
| 7,244,126 B2* | 7/2007 | Morana | H05K 1/0253 439/76.1 |
| 7,252,540 B2 | 8/2007 | Tanaka | |
| 7,352,257 B2 | 4/2008 | Sato et al. | |
| 7,520,757 B2* | 4/2009 | Bartholomew | H05K 1/0219 439/943 |
| 7,918,673 B1 | 4/2011 | Mimura et al. | |
| 9,572,246 B2* | 2/2017 | Tanaka | H01R 13/6473 |
| 9,590,353 B2* | 3/2017 | Regnier | H01R 13/6582 |
| 10,128,597 B2* | 11/2018 | Smith, Jr | H05K 1/0251 |
| 10,468,830 B2* | 11/2019 | Lee | H01R 13/6585 |
| 10,777,951 B2* | 9/2020 | Wu | H05K 1/117 |
| 2006/0134946 A1* | 6/2006 | William Vermeersch | H05K 1/117 439/76.1 |
| 2008/0038941 A1* | 2/2008 | Bartholomew | H05K 3/3405 439/76.1 |
| 2009/0144474 A1* | 6/2009 | Zhang | H05K 3/4092 710/301 |
| 2009/0277665 A1* | 11/2009 | Kumamoto | H05K 1/117 174/113 R |
| 2012/0040560 A1* | 2/2012 | Wang | H05K 1/117 439/607.31 |
| 2013/0017716 A1* | 1/2013 | Elkhatib | H01R 13/58 439/502 |
| 2013/0264107 A1* | 10/2013 | Meyers | H01R 13/6466 174/268 |
| 2014/0273657 A1* | 9/2014 | Hashim | H01R 13/6469 439/676 |
| 2014/0349496 A1* | 11/2014 | Zhu | H05K 1/0219 439/108 |
| 2015/0111402 A1* | 4/2015 | Hackman | H01R 13/65914 439/98 |
| 2016/0013599 A1* | 1/2016 | Ueda | H01R 13/6596 439/660 |
| 2016/0079714 A1* | 3/2016 | Wu | H01R 13/6585 439/607.05 |
| 2016/0365673 A1* | 12/2016 | Liang | H01R 13/6469 |
| 2017/0018881 A1* | 1/2017 | Patel | H01R 13/6616 |
| 2017/0099728 A1* | 4/2017 | Janssen | H04B 3/30 |
| 2017/0133799 A1* | 5/2017 | Scritzky | H01R 24/62 |
| 2017/0149183 A1* | 5/2017 | Gou | H01R 12/716 |
| 2018/0287280 A1* | 10/2018 | Ratkovic | H01R 12/62 |
| 2018/0309242 A1* | 10/2018 | Weidner | H01R 13/665 |
| 2020/0412062 A1* | 12/2020 | Minoru | H01R 12/727 |

FOREIGN PATENT DOCUMENTS

| | | |
|---|---|---|
| JP | 2002-042940 A | 2/2002 |
| JP | 2005-223127 A | 8/2005 |
| JP | 2006-351274 A | 12/2006 |
| JP | 2007-103301 A | 4/2007 |
| JP | 2008-193000 A | 8/2008 |
| JP | 2010-073549 A | 4/2010 |
| JP | 4575525 B1 | 11/2010 |
| JP | 2011-171123 A | 9/2011 |
| JP | 2011-171517 A | 9/2011 |

OTHER PUBLICATIONS

Japanese Office Action in JP 2018-227513, dated Dec. 18, 2019, with English translation.

* cited by examiner

CIRCUIT BOARD AND CABLE HARNESS PROVIDED WITH THE SAME

CROSS REFERENCE TO RELATED APPLICATIONS

This application is the National Stage of PCT/JP2019/041842 filed on Oct. 25, 2019, which claims priority under 35 U.S.C. § 119 of Japanese Application No. 2018-227513 filed on Dec. 4, 2018, the disclosure of which is incorporated by reference. The international application under PCT article 21(2) was not published in English.

TECHNICAL FIELD

The present invention relates to a circuit board and a cable harness provided with the circuit board.

BACKGROUND ART

There is known a circuit board which is used in a cable harness and connects between a connector and a cable. A circuit board of this type is disclosed in Patent Document 1, for example.

As shown in FIG. 21, a circuit board 90 disclosed in Patent Document 1 has a plurality of trace portions 901. To one end of each of the trace portions 901, a contact 921 of a sub-assembly (a connector) 92 is connected. Moreover, the other end of each of the trace portions 901 is formed with a wire connection portion 903. To the wire connection portions 903, electric wires (not shown) are connected. Thus, the circuit board 90 is used to connect between the sub-assembly 92 and the electric wires.

PRIOR ART DOCUMENTS

Patent Document(s)

Patent Document 1: JP 2010-73549 A

SUMMARY OF INVENTION

Technical Problem

Communication via a cable harness requires a circuit board which can obtain good signal transmission characteristics even when higher speed signals are used.

It is an object of the present invention to provide a circuit board having a structure showing good signal transmission characteristics for higher speed signals. Moreover, it is another object of the present invention to provide a cable harness provided with such a circuit board.

Solution to Problem

An aspect of the present invention provides, as a first circuit board, a circuit board which is used to connect terminals of a connector to electric wires, wherein:

the circuit board comprises a first layer, a second layer and a dielectric layer;

the dielectric layer is interposed between the first layer and the second layer;

each of the first layer and the second layer is provided with a polarity of trace portions;

each of the trace portions has a connection portion to be connected to the terminal, a wire connection portion to be connected to the electric wire and a line portion connecting between the connection portion and the wire connection portion;

the trace portions of the first layer include two first signal trace portions and a second ground trace portion, the two first signal wiring portions forming a first differential pair;

the first signal trace portions and the second ground trace portion are juxtaposed with each other in a pitch direction;

the trace portions of the second layer include two second signal trace portions and a first ground trace portion, the two second signal wiring portions forming a second differential pair;

the second signal trace portions and the first ground trace portion are juxtaposed with each other in the pitch direction;

in the pitch direction, outer edges of the line portions of the two first signal trace portions are located inward of both edges of the line portion of the first ground trace portion, and outer edges of the line portions of the two second signal trace portions are located inward of both edges of the line portion of the second ground trace portion.

Moreover, according to another aspect of the present invention, a cable harness comprising the first circuit board, the connector and the electric wires can be obtained as a first cable harness.

Advantageous Effects of Invention

In the circuit board, the two first signal trace portions forming the first differential pair are formed in the first layer while the first ground trace portion is formed in the second layer. Moreover, the two second signal trace portions forming the second differential pair are formed in the second layer while the second ground trace portion is formed in the first layer. Then, in the pitch direction, the outer edges of the line portions of the two first signal trace portions are located inward of the both edges of the line portion of the first ground trace portion. Moreover, the outer edges of the line portions of the two second signal trace portions are located inward of the both edges of the line portion of the second ground trace portion in the pitch direction. In this structure, when viewed along the up-down direction perpendicular to the pitch direction, the line portions of the first signal trace portions overlap with the line portion of the first ground trace portion while the line portions of the second signal trace portions overlap with the line portion of the second ground trace portion. Thus, the circuit board can realize good signal transmission characteristics.

An appreciation of the objectives of the present invention and a more complete understanding of its structure may be had by studying the following description of the preferred embodiment and by referring to the accompanying drawings.

DESCRIPTION OF EMBODIMENTS

Figure 1:
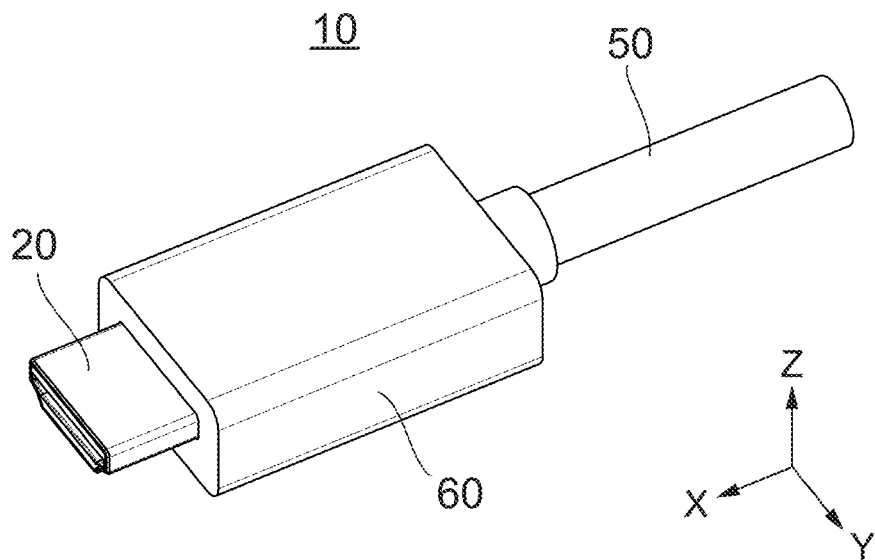
FIG. 1 is a perspective view showing a cable harness according to a first embodiment of the present invention.

While the invention is susceptible of various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

First Embodiment

Figure 2:
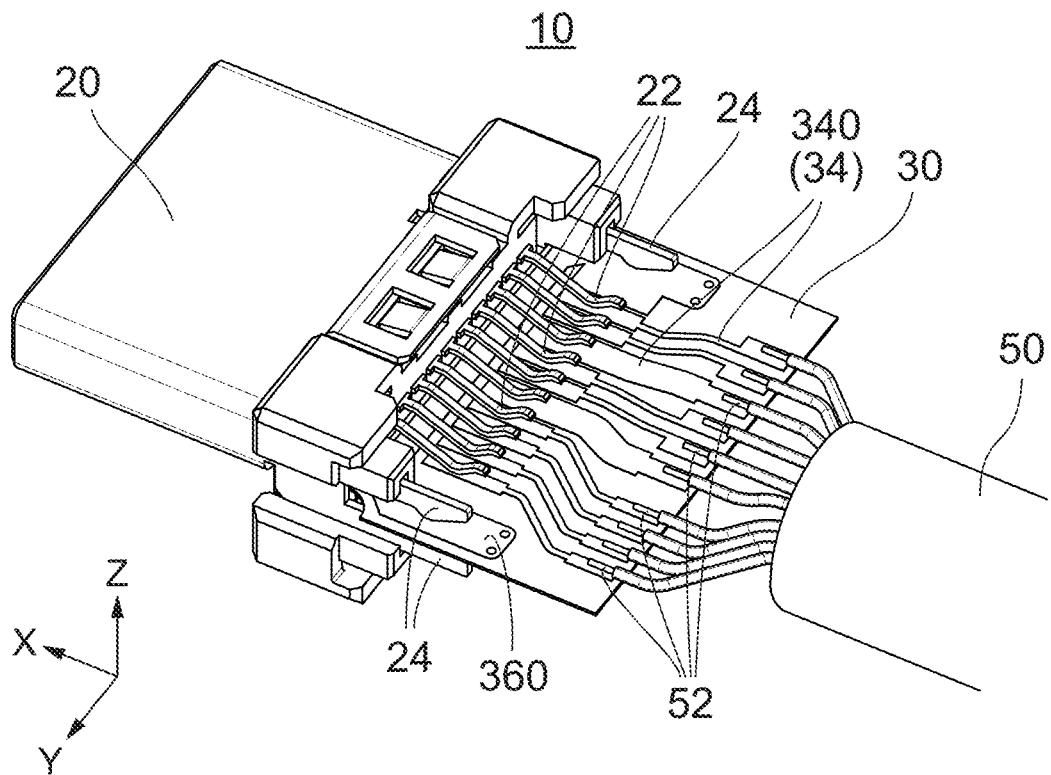
FIG. 2 is another perspective view showing the cable harness of FIG. 1. A hood which covers a circuit board and end portions of electric wires is removed. Moreover, coated electric wires to be connected to a second wiring layer of the circuit board is omitted.

Referring to FIGS. 1 and 2, a cable harness 10 according to a first embodiment of the present invention is provided with a connector 20, a circuit board 30, a cable 50 and a hood 60. Although the connector 20 is an HDMI (High-Definition Multimedia Interface) (Registered Trademark) connector in the present embodiment, the present invention is not limited thereto. The present invention is applicable to any connector which is provided with a differential signal transmission path.

As understood from FIG. 2, the circuit board 30 is held by the connector 20 and connects between the connector 20 and the cable 50. In detail, the connector 20 is provided with a plurality of terminals 22 and two pairs of fixed portions 24. The fixed portions 24 are parts of a shell of the connector 20. The circuit board 30 is provided with a first wiring layer (a first layer) and a second wiring layer (a second layer) 37 (see FIG. 4). Each of the terminals 22 of the connector 20 is connected to any one of one end portions of trace portions 340 of the first wiring layer 34 and trace portions 370 of the second wiring layer 37 (see FIG. 4). Each of the fixed portions 24 of the connector 20 is connected and fixed to a fixing portion 360 of the first wiring layer 34 or a fixing portion 390 of the second wiring layer 37 (see FIG. 4) using solder or the like. On the other hand, the cable 50 has a plurality of coated electric wires (electric wires) 52. Each of the coated electric wires 52 of the cable 50 is connected and fixed to any one of the other end portions of the trace portions 340 of the first wiring layer 34 and the trace portions 370 of the second wiring layer 37 (see FIG. 4). Interposing the circuit board 30 between the connector 20 and the cable 50 allows an interval between the coated electric wires 52 adjacent to each other to be wider than an interval between the terminals 22 adjacent each other in a pitch direction. In the present embodiment, the pitch direction is a Y-direction.

Figure 3:
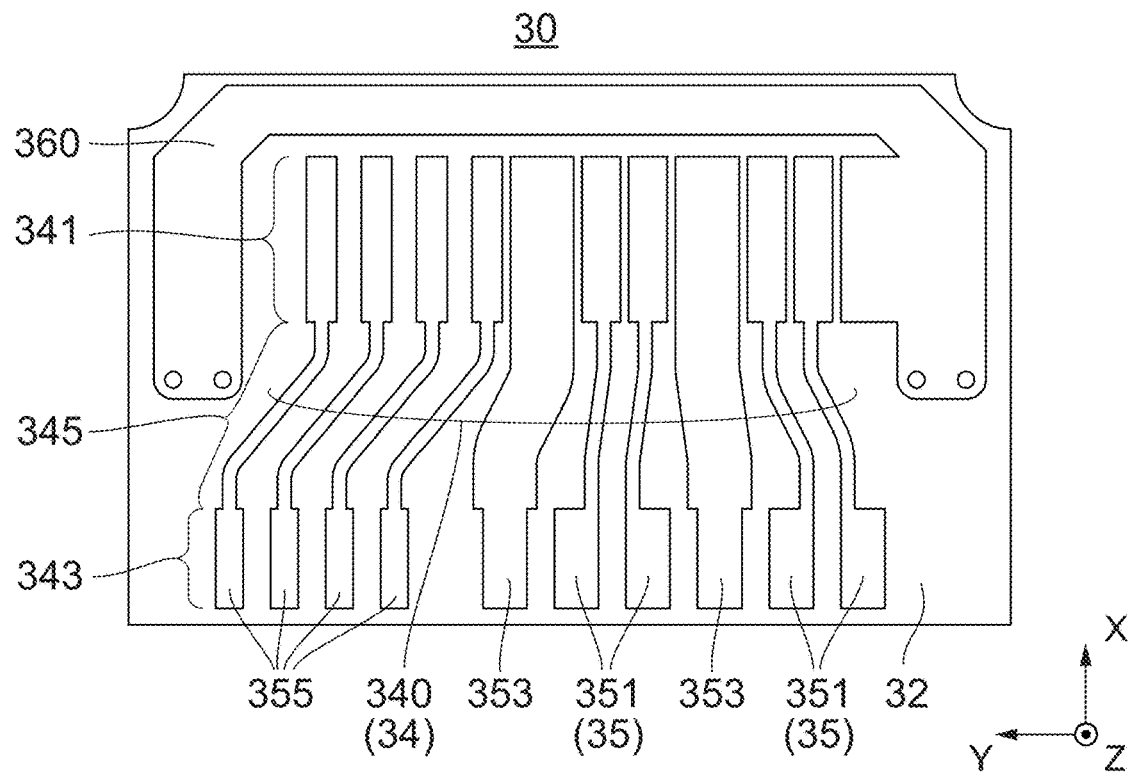
FIG. 3 is a plane view showing the circuit board included in the cable harness of FIG. 2.
Figure 4:
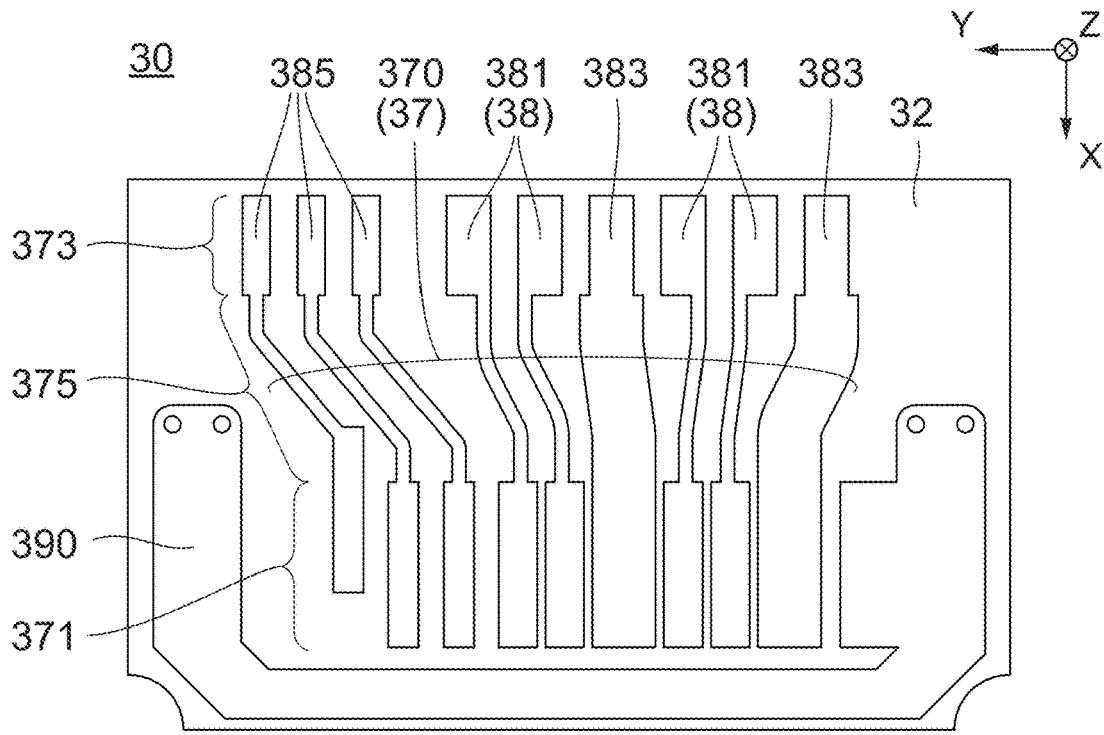
FIG. 4 is a bottom view showing the circuit board of FIG. 3.

Referring to FIGS. 3 and 4, the circuit board 30 is provided with a dielectric layer 32, a first wiring layer (a first layer) 34 formed on an upper surface of the dielectric layer 32 and a second wiring layer (a second layer) 37 formed on a lower surface of the dielectric layer 32. However, the present invention is not limited thereto. The first wiring layer 34 and the second wiring layer 37 may be formed on dielectric layers different from each other, respectively, and they may be put on each other to be joined. At any rate, the dielectric layer 32 should be located between the first wiring layer 34 and the second wiring layer 37 in an up-down direction to be sandwiched between the first wiring layer 34 and the second wiring layer 37. In the present embodiment, the up-down direction is a Z-direction. A positive Z-direction is directed upward while a negative Z-direction is directed downward.

As shown in FIG. 3, the first wiring layer 34 is provided with a plurality of the trace portions 340 and the fixing portion 360. The trace portions 340 are used for transmission of signals. The fixing portion 360 is used to fix the fixed portions 24 of the connector 20 (see FIG. 2).

As shown in FIG. 3, each of the trace portions 340 has a connection portion 341, a wire connection portion 343 and a line portion 345. The connection portion 341 is a part to be connected to the terminal 22 of the connector 20 (see FIG. 2). The wire connection portion 343 is a part to which the coated electric wire 52 of the cable 50 (see FIG. 2) is connected and fixed. The line portion 345 is a part to couple between the connection portion 341 and the wire connection portion 343 which correspond to each other.

As shown in FIG. 3, the connection portions 341 of the plurality of the trace portions 340 are arranged in the pitch direction, and adjacent two of the connection portions 341 are separated by a space. Also, the wire connection portions 343 are arranged in the pitch direction, and adjacent two of the wire connection portions 343 are separated by a space. Also, the line portions 345 are arranged in the pitch direction, and adjacent two of the connection portions 341 are separated by a space.

Referring to FIG. 4, the second wiring layer 37 is provided with a plurality of the trace portions 370 and the fixing portion 390. Similarly to the case of the first wiring layer 34, the trace portions 370 are used for transmission of signals, and the fixing portion 390 is used to fix the fixed portions 24 of the connector 20 (see FIG. 2).

As shown in FIG. 4, each of the trace portions 370 has a connection portion 371, a wire connection portion 373 and a line portion 375. The connection portion 371 is a part to be connected to the terminal 22 of the connector 20 (see FIG. 2). The wire connection portion 373 is a part to which the coated electric wire 52 of the cable 50 (see FIG. 2) is connected. The line portion 375 is a part which couple between the connection portion 371 and the wire connection portion 373.

As shown in FIG. 4, the connection portions 371 of the plurality of the trace portions 370 are arranged in the pitch direction. However, one of the trace portions 370 is different from the other trace portions 370 in position of the connection portion 371 in a front-rear direction perpendicular to both of the pitch direction and the up-down direction. In the present embodiment, the front-rear direction is an X-direction. Adjacent two of the connection portions 371 are separated by a space. Also, the wire connection portions 373 are arranged in the pitch direction, and adjacent two of the wire connection portions 373 are separated by a space. Also, the line portions 375 are arranged in the pitch direction, and adjacent two of the line portion 375 are separated by a space.

Referring FIG. 3 again, the trace portions 340 of the first wiring layer 34 include four first signal trace portions 351 forming two first differential pairs 35. Moreover, the trace portions 340 include two second ground trace portions 353. Furthermore, the trace portions 340 include four third signal trace portions 355. The first signal trace portions 351 are used for transmission of high-speed signals, and the third signal trace portions 355 are used for transmission of low-speed signals. A size of each of the connection portions 341 of the first signal trace portions 351 and the third signal trace portions 355 is larger than a size of the line portion 345 corresponding thereto in the pitch direction. Also, a size of each of the wire connection portions 343 of the first signal trace portions 351 and the third signal trace portions 355 is larger than the size of the line portion 345 corresponding thereto in the pitch direction. On the other hand, a size of each of the connection portions 341 of the second ground trace portions 353 is equal to a size of the line portion 345 corresponding thereto in the pitch direction. Moreover, a size of each of the wire connection portions 343 of the second ground trace portions 353 is smaller than the size of the line portion 345 corresponding thereto in the pitch direction.

Referring to FIG. 4 again, the trace portions 370 of the second wiring layer 37 include four second signal trace portions 381 forming two second differential pairs 38. Moreover, the trace portions 370 include two first ground trace portions 383. Furthermore, the trace portions 370 include three fourth signal trace portions 385. The second signal trace portions 381 are used for transmission of high-speed signals, and the fourth signal trace portions 385 are used for transmission of low-speed signals. A size of each of the connection portions 371 of the second signal trace portions 381 and the fourth signal trace portions 385 is larger than a size of the line portion 375 corresponding thereto in the pitch direction. Also, a size of each of the wire connection portions 373 of the second signal trace portions 381 and the fourth signal trace portions 385 is larger than the size of the line portion 375 corresponding thereto in the pitch direction. On the other hand, a size of each of the connection portions 371 of the first ground trace portions 383 is equal to a size of the line portion 375 corresponding thereto in the pitch direction. Moreover, a size of each of the wire connection portions 373 of the first ground trace portions 383 is smaller than the size of the line portion 375 corresponding thereto in the pitch direction.

Figure 5:
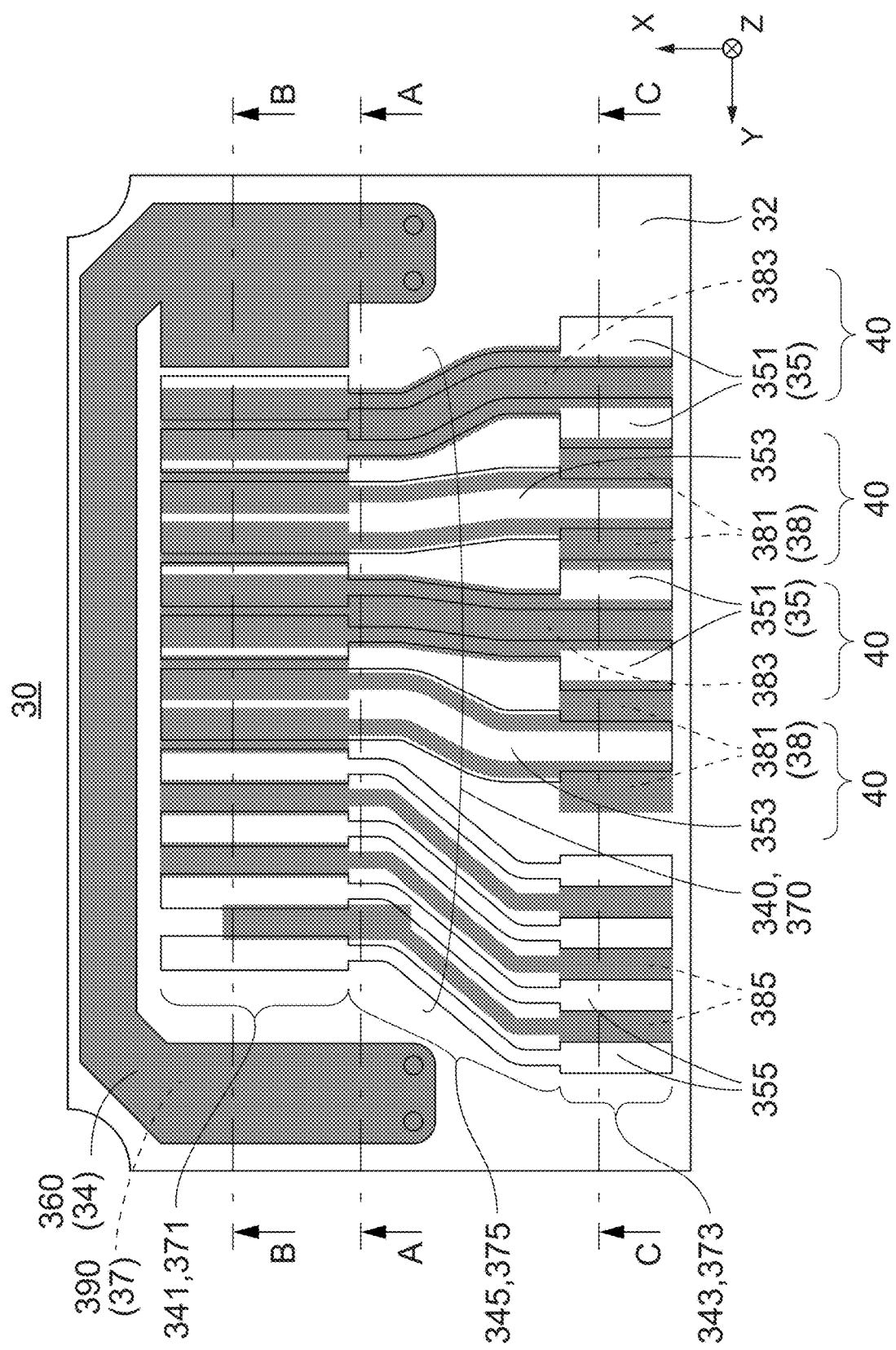
FIG. 5 is another plane view showing the circuit board of FIG. 3. A wiring pattern forming the second wiring layer is represented by a gray tone.

As understood from FIG. 5, when viewed along the up-down direction, each of the first differential pairs 35 overlaps with one of the first ground trace portions 383. Moreover, each of the second differential pairs 38 overlaps with one of the second ground trace portions 353. Thus, the first differential pair 35 and the first ground trace portion 383 correspond to each other, and the second differential pair 38 and the second ground trace portion 353 correspond to each other. The first differential pair 35 and the first ground trace portion 383 which correspond to each other and the second differential pair 38 and the second ground trace portion 353 which correspond to each other form high-speed signal transmission paths (transmission paths) 40, respectively. Thus, the circuit board 30 according to the present embodiment is provided with a plurality of sets of the high-speed signal transmission paths 40. In the present embodiment, the number of sets of the high-speed signal transmission paths 40 is four. However, the present invention is not limited thereto. The number of sets of the high-speed signal transmission paths 40 should be two or more. Preferably, the number of sets of the high-speed signal transmission paths 40 is even number. This is because good signal transmission characteristics can be obtained by arranging the high-speed signal transmission paths 40 symmetrically.

As understood from FIGS. 3 and 4, a shape of a first wiring pattern which consists of the first signal trace portions 351 and the second ground trace portions 353 and a shape of a second wiring pattern which consists of the second signal trace portions 381 and the first ground trace portions 383 are same as each other. Accordingly, provided that the first wiring pattern and the second wiring pattern are in a specified positional relationship, they are rotational symmetrical to each other. In the present embodiment, the first wiring pattern and the second wiring pattern are arranged so that the high-speed signal transmission paths 40 formed by these patterns are rotational symmetrical as a whole. Its symmetrical axis is an imaginary line extending along the front-rear direction and located on a line passing through a middle, in the up-down direction, of the dielectric layer 32. This symmetrical axis is off the middle of the circuit board 30 in the pitch direction. Since the high-speed signal transmission paths 40 are arranged to be rotational symmetry as a whole as just described, intervals of the wire connection portions 343 or 373 in the pitch direction can be widened while a difference in length between the first differential pairs 35 and the second differential pairs 38 can be reduced.

As shown in FIG. 5, the high-speed signal transmission paths 40 are arranged in the pitch direction. And, the first differential pairs 35 and the second differential pairs 38 are alternately arranged in the pitch direction. In other words, the first differential pairs 35 and the second ground trace portions 353 are alternately arranged in the pitch direction, and the second differential pairs 38 and the first ground trace portions 383 are alternately arranged in the pitch direction. Accordingly, the two first signal trace portions 351 forming each of the first differential pairs 35 and at least one of the second ground trace portions 353 are adjacent to each other in the pitch direction. Moreover, the two second signal trace portions 381 forming each of the second differential pairs 38 and at least one of the first ground trace portions 383 are adjacent to each other in the pitch direction. Accordingly, crosstalk between two of the first differential pairs 35 and crosstalk between two of the second differential pairs 38 can be reduced.

Figure 6:
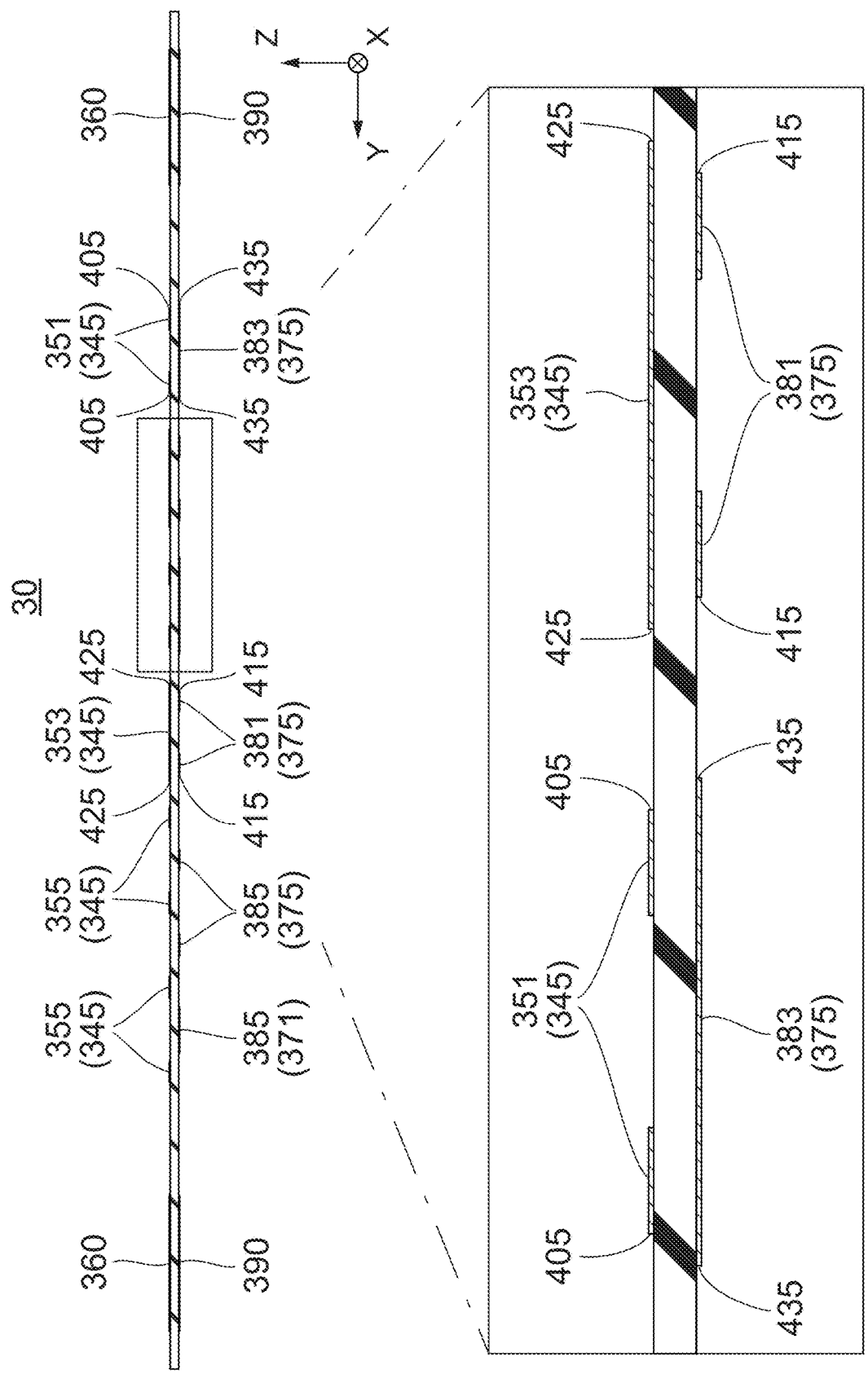
FIG. 6 is a cross-sectional view showing the circuit board of FIG. 5, taken along line A-A. A part of the circuit board is illustrated in an enlarged fashion. Two high speed signal transmission paths located inward in a pitch direction are included in the part illustrated in the enlarged fashion.

As understood from FIGS. 5 and 6, when viewed along the up-down direction, in the pitch direction, outer edges 405 of the line portions 345 of the two first signal trace portions 351 forming each of the first differential pairs 35 are located inward of both of edges (both edges) 435 of the line portion 375 of the first ground trace portion 383 corresponding thereto. Similarly, when viewed along the up-down direction, in the pitch direction, outer edges 415 of the line portions 375 of the two second signal trace portions 381 forming each of the second differential pairs 38 are located inward of both of edges (both edges) 425 of the line portion 345 of the second ground trace portion 353 corresponding thereto. With this structure, signal transmission characteristics equal to that in a case of using a ground layer of a solid pattern can be obtained.

Figure 7:
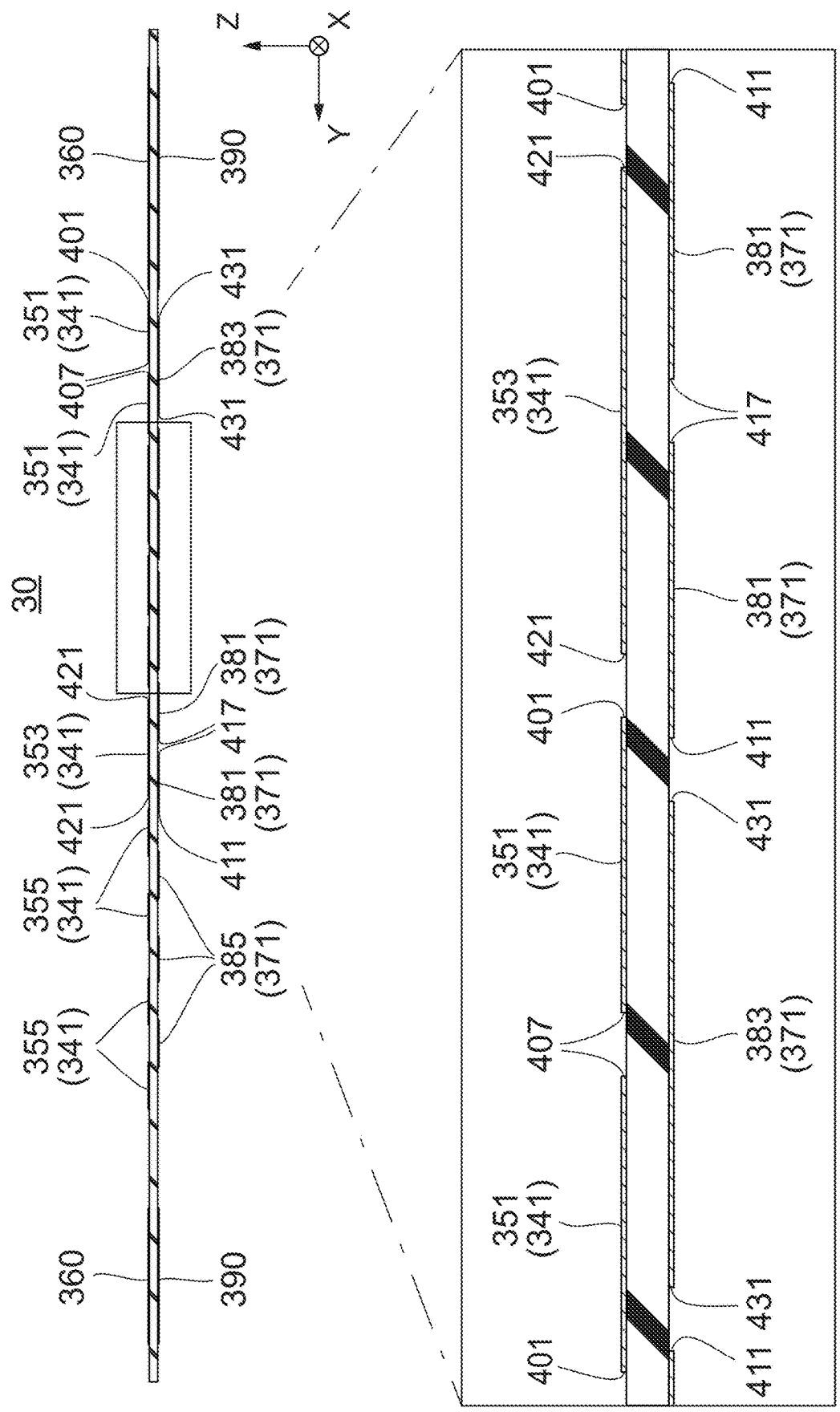
FIG. 7 is a cross-sectional view showing the circuit board of FIG. 5, taken along line B-B. A part of the circuit board is illustrated in an enlarged fashion. The two high speed signal transmission paths located inward in the pitch direction are included in the part illustrated in the enlarged fashion.

Referring to FIGS. 5 and 7, in the pitch direction, each of outer edges 401 of the connection portions 341 of the two first signal trace portions 351 forming each of the first differential pairs 35 is located outward of both of edges (both edges) 431 of the connection portion 371 of the first ground trace portion 383 corresponding thereto at least in part. In the present embodiment, in the pitch direction, the whole of each of the outer edges 401 of the connection portions 341 of the two first signal trace portions 351 forming each of the first differential pairs 35 is located outward of both of the edges (the both edges) 431 of the connection portion 371 of the first ground trace portion 383 corresponding thereto. Moreover, in the pitch direction, each of inner edges 407 of the connection portions 341 of the two first signal trace portions 351 forming each of the first differential pairs 35 is located inward of the both edges 431 of the connection portion 371 of the first ground trace portion 383 corresponding thereto. Similarly, in the pitch direction, each of outer edges 411 of the connection portions 371 of the two second signal trace portions 381 forming each of the second differential pairs 38 is located outward of both of edges (both edges) 421 of the connection portion 341 of the second ground trace portion 353 corresponding thereto at least in part. In the present embodiment, in the pitch direction, the whole of each of the outer edges 411 of the connection portions 371 of the two second signal trace portions 381 forming each of the second differential pairs 38 is located outward of both of the edges (the both edges) 421 of the connection portion 341 of the second ground trace portion 353 corresponding thereto. Moreover, in the pitch direction, each of inner edges 417 of the connection portions 371 of the two second signal trace portions 381 forming each of the second differential pairs 38 is located inward of the both edges 421 of the connection portion 341 of the second ground trace portion 353 corresponding thereto. With this structure, an area necessary for each of the connection portions 341 and 371 can be secured, and steep impedance changes in each of the first signal trace portions 351 and the second signal trace portions 381 can be suppressed.

Figure 8:
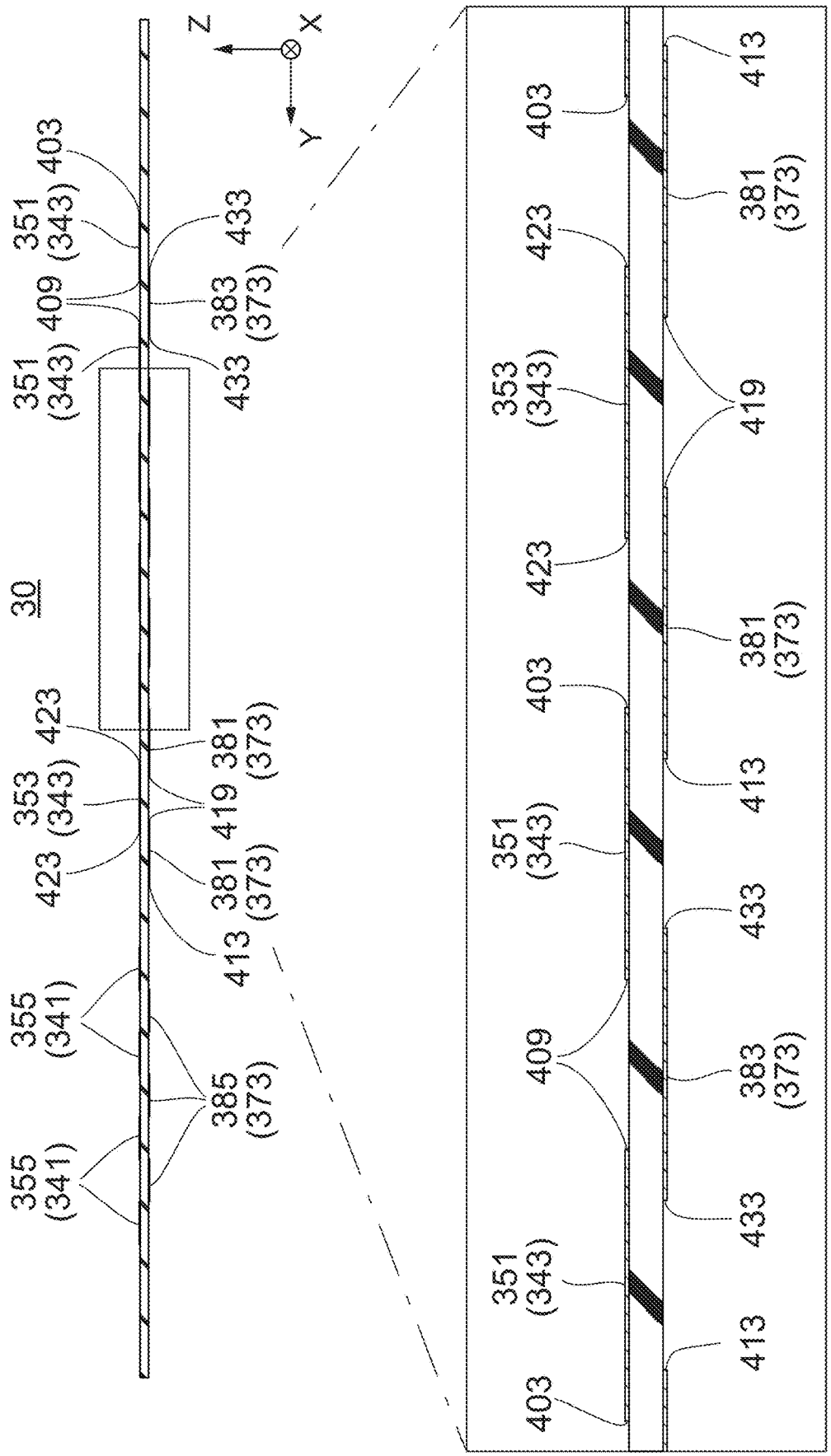
FIG. 8 is a cross-sectional view showing the circuit board of FIG. 5, taken along line C-C. A part of the circuit board is illustrated in an enlarged fashion. The two high speed signal transmission paths located inward in the pitch direction are included in the part illustrated in the enlarged fashion.

Furthermore, referring to FIGS. 5 and 8, in the pitch direction, each of outer edges 403 of the wire connection portions 343 of the two first signal trace portions 351 forming each of the first differential pairs 35 is located outward of both of edges (both edges) 433 of the wire connection portion 373 of the first ground trace portion 383 corresponding thereto at least in part. In the present embodiment, in the pitch direction, the whole of each of the outer edges 403 of the wire connection portions 343 of the two first signal trace portions 351 forming each of the first differential pairs 35 is located outward of both of the edges (the both edges) 433 of the wire connection portion 373 of the first ground trace portion 383 corresponding thereto. Moreover, in the pitch direction, each of inner edges 409 of the wire connection portions 343 of the two first signal trace portions 351 forming each of the first differential pairs 35 is located inward of the both edges 433 of the wire connection portion 373 of the first ground trace portion 383 corresponding thereto. Similarly, in the pitch direction, each of outer edges 413 of the wire connection portions 373 of the two second signal trace portions 381 forming each of the second differential pairs 38 is located outward of both of edges (both edges) 423 of the wire connection portion 343 of the second ground trace portion 353 corresponding thereto at least in part. In the present embodiment, in the pitch direction, the whole of each of the outer edges 413 of the wire connection portions 373 of the two second signal trace portions 381 forming each of the second differential pairs 38 is located outward of both of the edges (the both edges) 423 of the wire connection portion 343 of the second ground trace portion 353 corresponding thereto. Moreover, in the pitch direction, each of inner edges 419 of the wire connection portions 373 of the two second signal trace portions 381 forming each of the second differential pairs 38 is located inward of the both edges 423 of the wire connection portion 343 of the second ground trace portion 353 corresponding thereto. With this structure, in the pitch direction, an enough space is secured each of between the wire connection portions 343 adjacent to each other and between the wire connection portions 373 adjacent to each other, and steep impedance changes in each of the first signal trace portions 351 and the second signal trace portions 381 can be suppressed.

According to the structure as described above, the circuit board 30 according to the present embodiment can realize good signal transmission characteristics with a simple structure.

Second Embodiment

Figure 9:
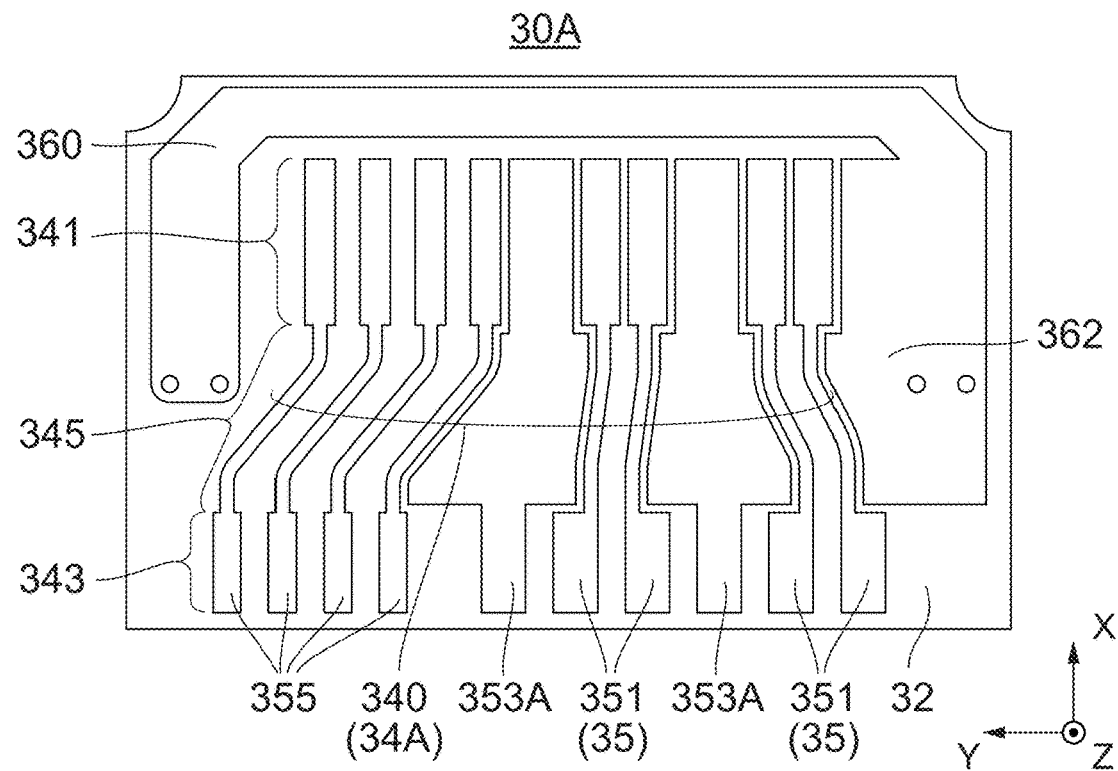
FIG. 9 is a plane view showing a circuit board according to a second embodiment of the present invention.
Figure 10:
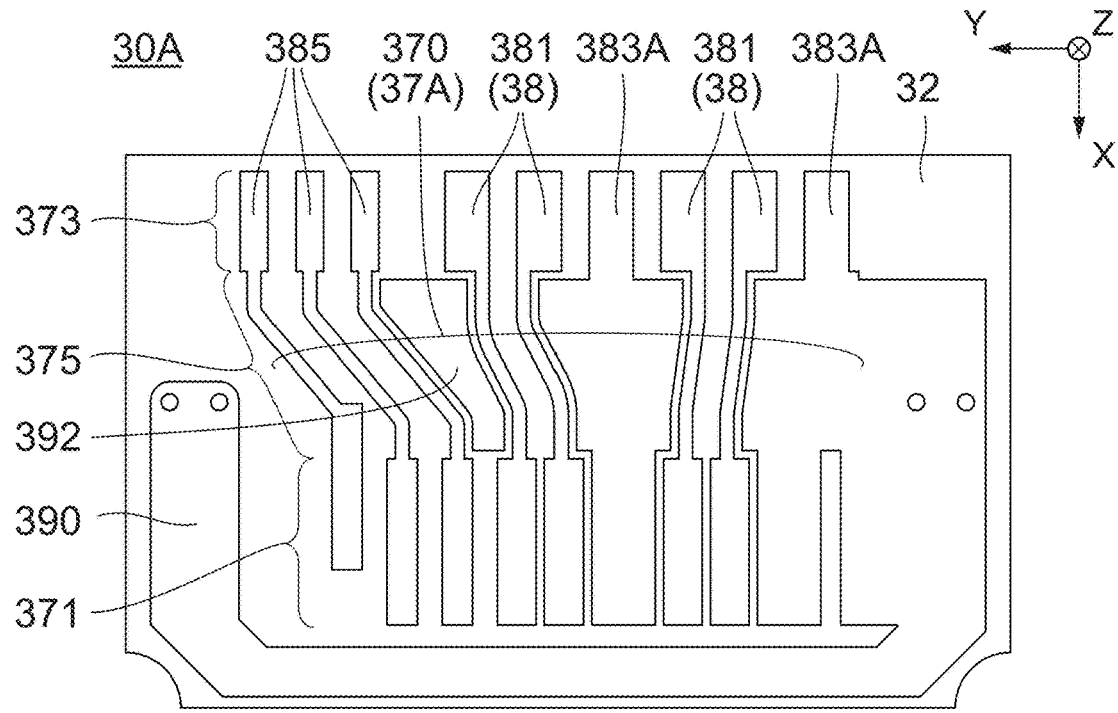
FIG. 10 is a bottom view showing the circuit board of FIG. 9.

Referring to FIGS. 9 and 10, a circuit board 30A according to a second embodiment of the present invention has a first wiring layer 34A and a second wiring layer 37A which have pattern shapes different from those of the first wiring layer 34 and the second wiring layer 37 of the circuit board 30 according to the first embodiment. Other points of the circuit board 30A are common with those of the circuit board 30, and therefore the description thereof will be omitted.

As shown in FIG. 9, the first wiring layer (first layer) 34A has second ground trace portions 353A. The line portion 345 of each of the second ground trace portions 353A is widen in part in the pitch direction so that a distance to each of the first signal trace portions 351 and the third signal trace portions 355 which are adjacent to the second ground trace portion 353A is equal to a predetermined distance. Moreover, the first wiring layer 34A has an additional ground portion 362. The additional ground portion 362 is integrally formed with the fixing portion 360 and widen in the pitch direction so that a distance to the first signal trace portion 351 adjacent to the additional ground portion 362 is equal to a predetermined distance.

As shown in FIG. 10, the second wiring layer (second layer) 37A has first ground trace portions 383A. The line portion 375 of each of the first ground trace portion 383A is widen in the pitch direction so that a distance to each of the second signal trace portions 381 adjacent to the first ground trace portion 383A is equal to a predetermined distance. Moreover, one of the first ground trace portions 383A is integrally formed with the fixing portion 390. Furthermore, the second wiring layer 37A has an additional ground portion 392. The additional ground portion 392 is formed so that a distance to each of the second signal trace portion 381 and the fourth signal trace portion 385 which are adjacent to the additional ground portion 392 is equal to a predetermined distance.

Figure 11:
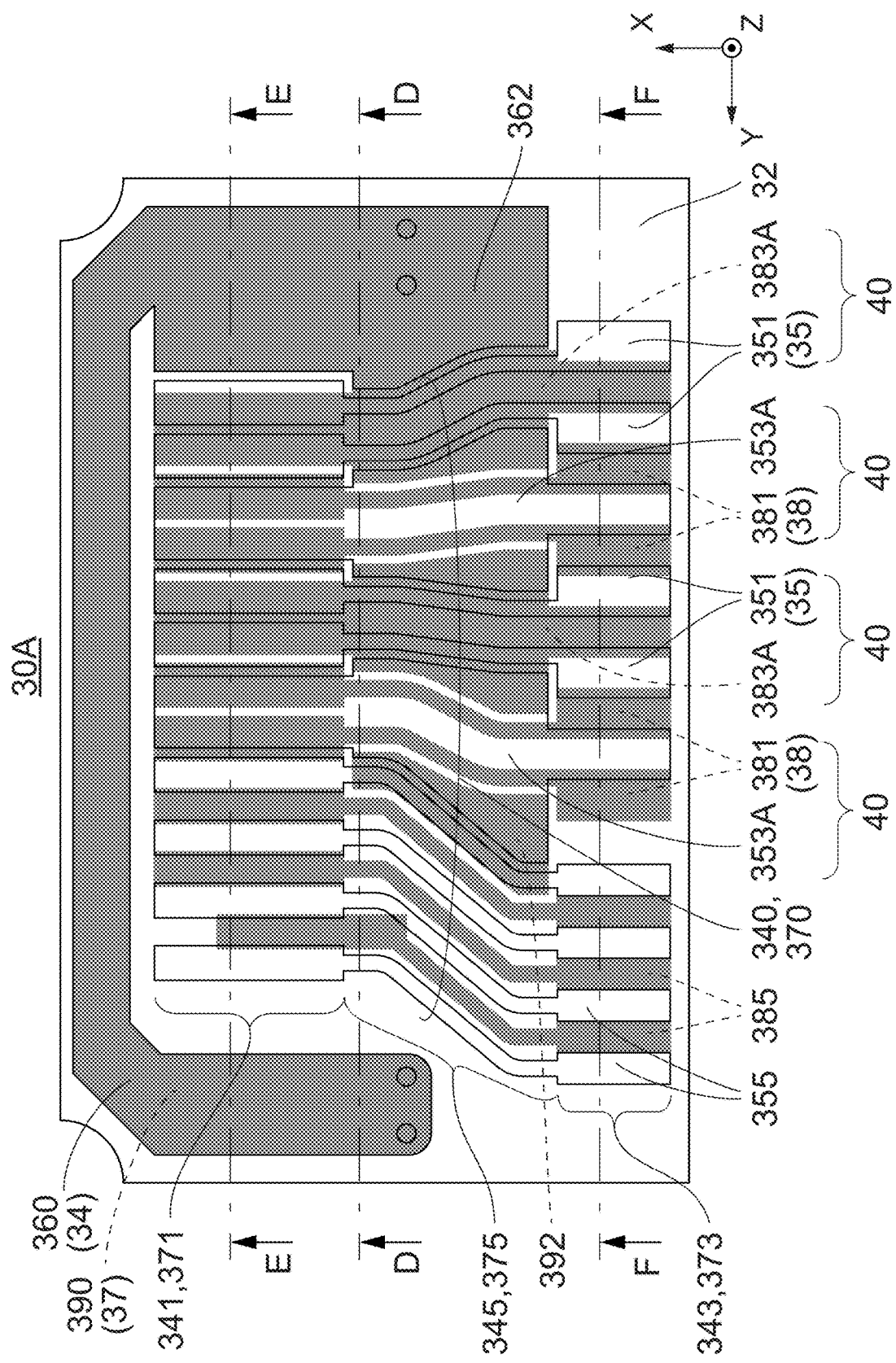
FIG. 11 is another plane view showing the circuit board of FIG. 9. A wiring pattern forming a second wiring layer is represented by a gray tone.
Figure 12:
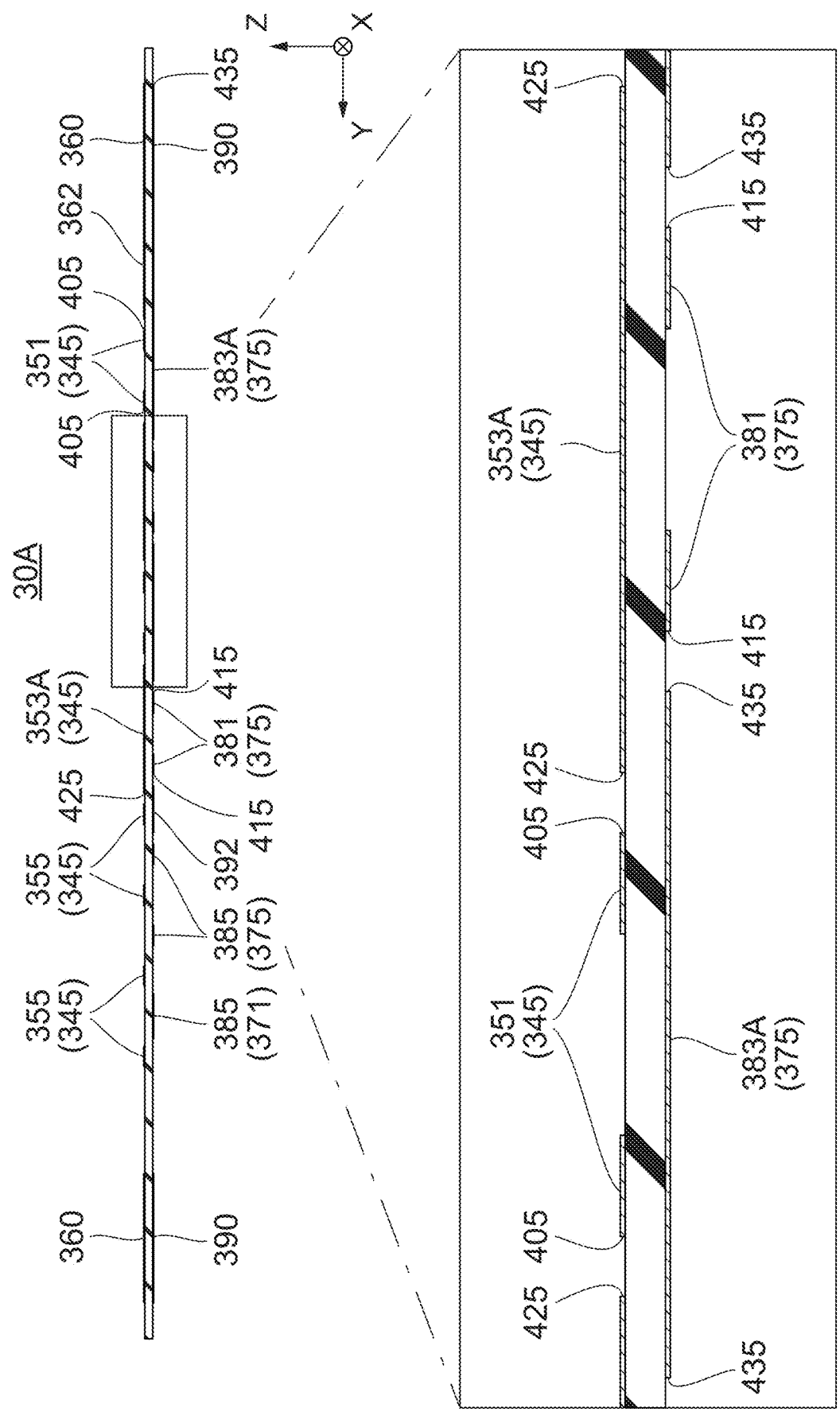
FIG. 12 is a cross-sectional view showing the circuit board of FIG. 11, taken along line D-D. A part of the circuit board is illustrated in an enlarged fashion. Two high speed signal transmission paths located inward in the pitch direction are included in the part illustrated in the enlarged fashion.
Figure 13:
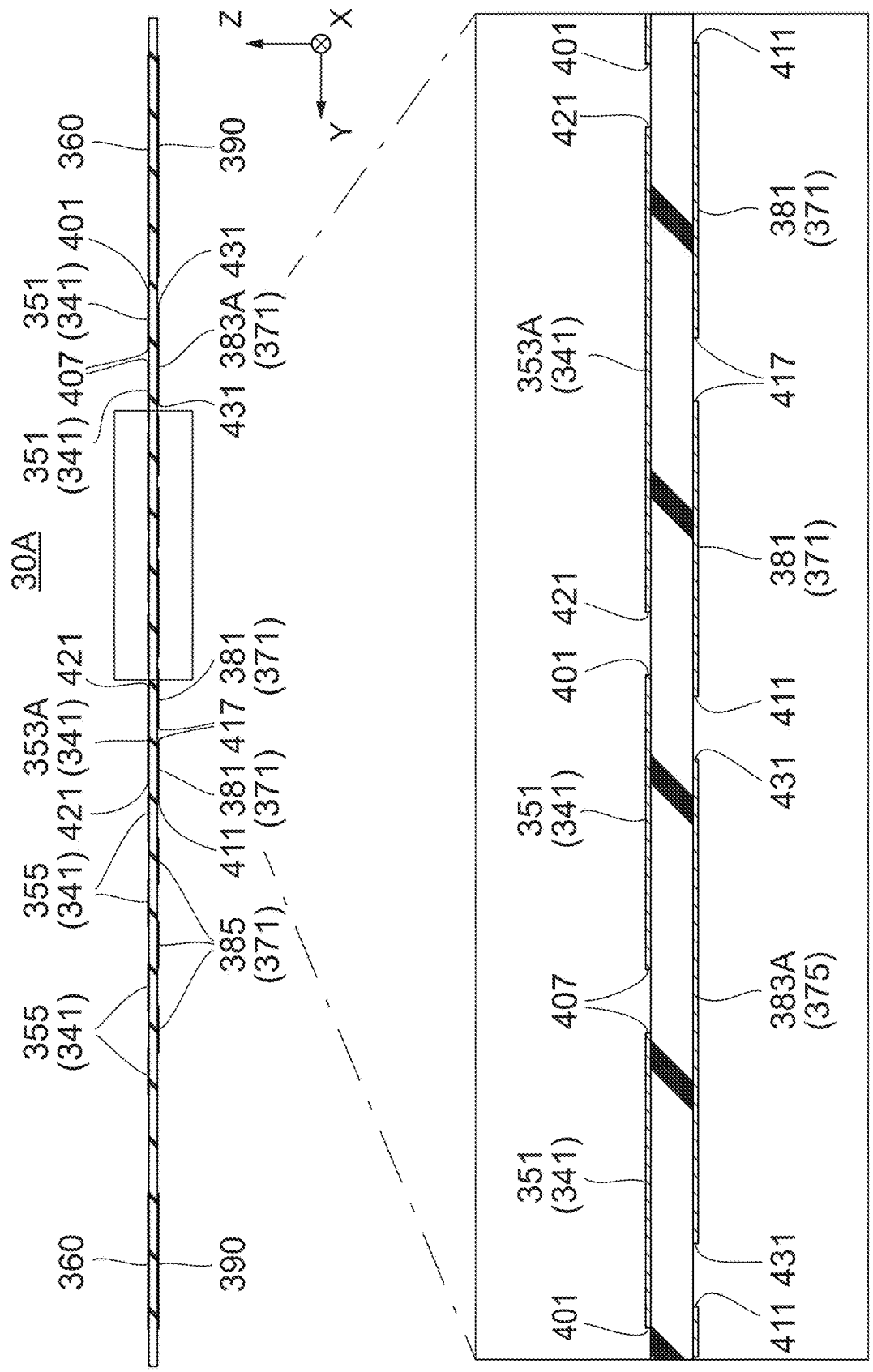
FIG. 13 is a cross-sectional view showing the circuit board of FIG. 11, taken along line E-E. A part of the circuit board is illustrated in an enlarged fashion. The two high speed signal transmission paths located inward in the pitch direction are included in the part illustrated in the enlarged fashion.
Figure 14:
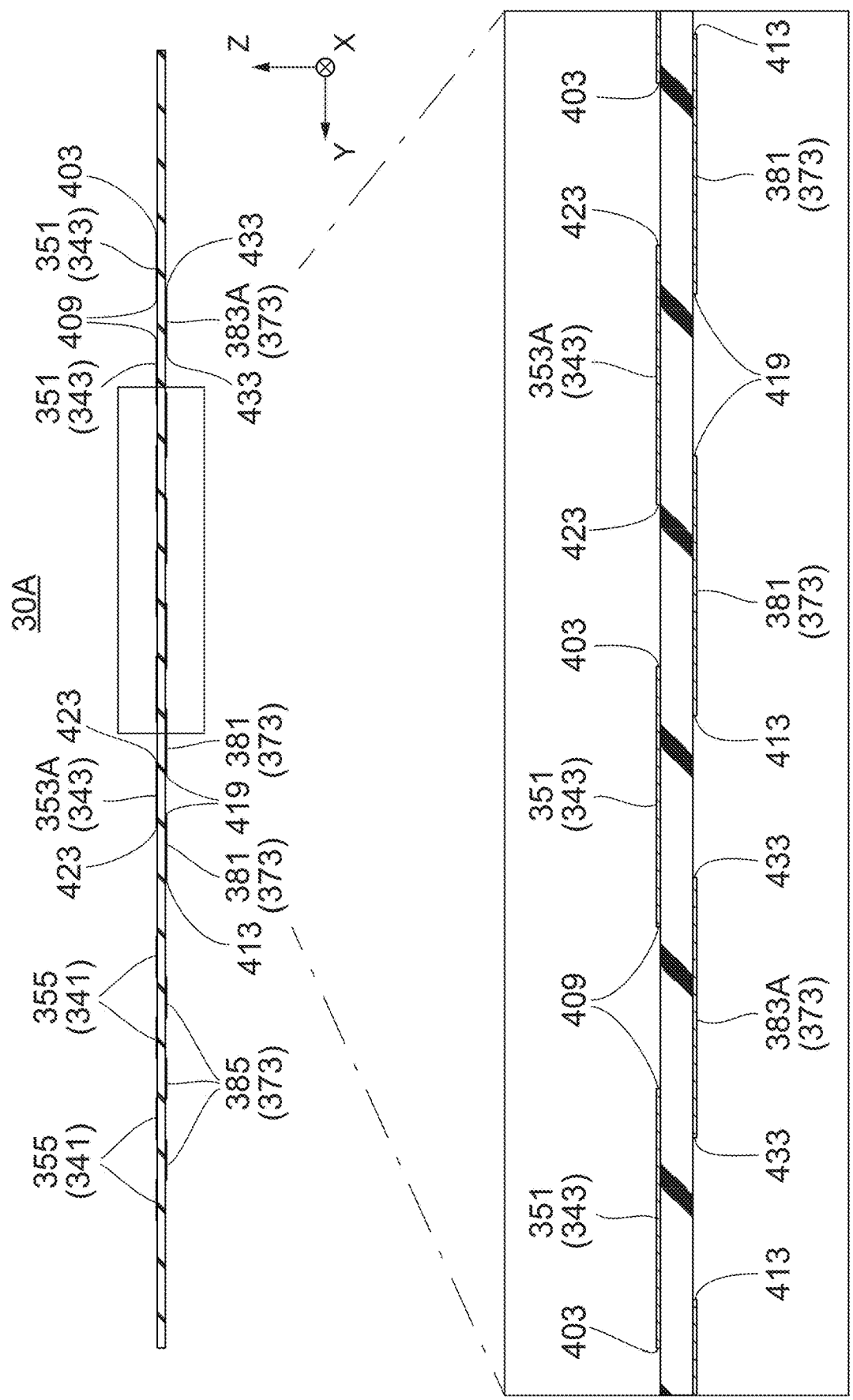
FIG. 14 is a cross-sectional view showing the circuit board of FIG. 11, taken along line F-F. A part of the circuit board is illustrated in an enlarged fashion. The two high speed signal transmission paths located inward in the pitch direction are included in the part illustrated in the enlarged fashion.

As understood from FIGS. 11 and 12, when viewed along the up-down direction, the line portion 375 of each of the first ground trace portions 383A overlaps with at least one of the line portions 345 of the second ground trace portions 353A. Similarly, the line portion 345 of each of the second ground trace portions 353 overlaps with at least one of the line portions 375 of the first ground trace portions 383A. Moreover, the additional ground portion 362 overlaps with the line portion 375 of one of the first ground trace portions 383A. Furthermore, the additional ground portion 392 overlaps with the line portion 345 of one of the second ground trace portions 353A. As just described, sizes of the line portions 375 and 345 of the first ground trace portions 383 and the second ground trace portions 353A are widen in the pitch direction, and the additional ground portions 362 and 293 are provided. Accordingly, a ground function of the circuit board 30A can be enhanced, and signal transmission characteristics can be improved.

As understood from a comparison between FIGS. 11, 13 and 14 and FIGS. 5, 7 and 8, pattern shapes of the connection portions 341 and 371 and the wire connection portions 343 and 373 of the circuit board 30A are same as those of the circuit board 30.

Third Embodiment

Figure 15:
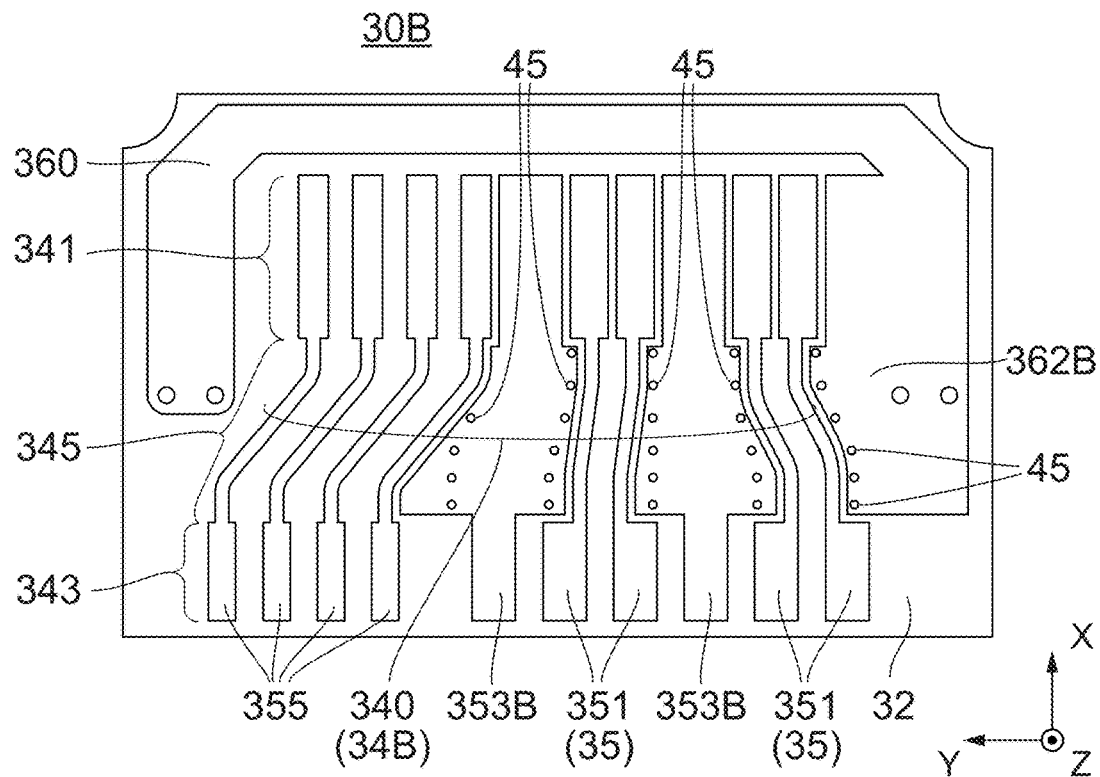
FIG. 15 is a plane view showing a circuit board according to a third embodiment of the present invention.
Figure 16:
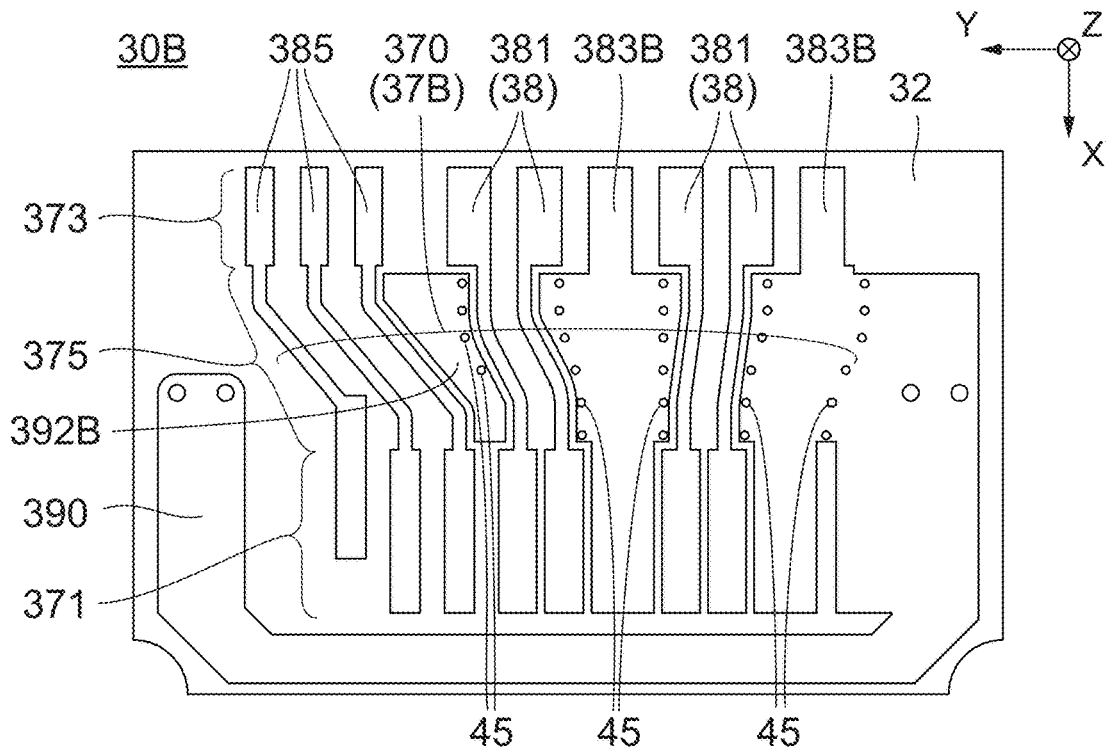
FIG. 16 is a bottom view showing the circuit board of FIG. 15.

Referring to FIGS. 15 and 16, a circuit board 30B according to a third embodiment of this present invention is different from the circuit board 30A according to the second embodiment in a point of having a plurality of via holes 45. Other points of the circuit board 30B are common with those of the circuit board 30A, and the description thereof will be omitted.

Figure 17:
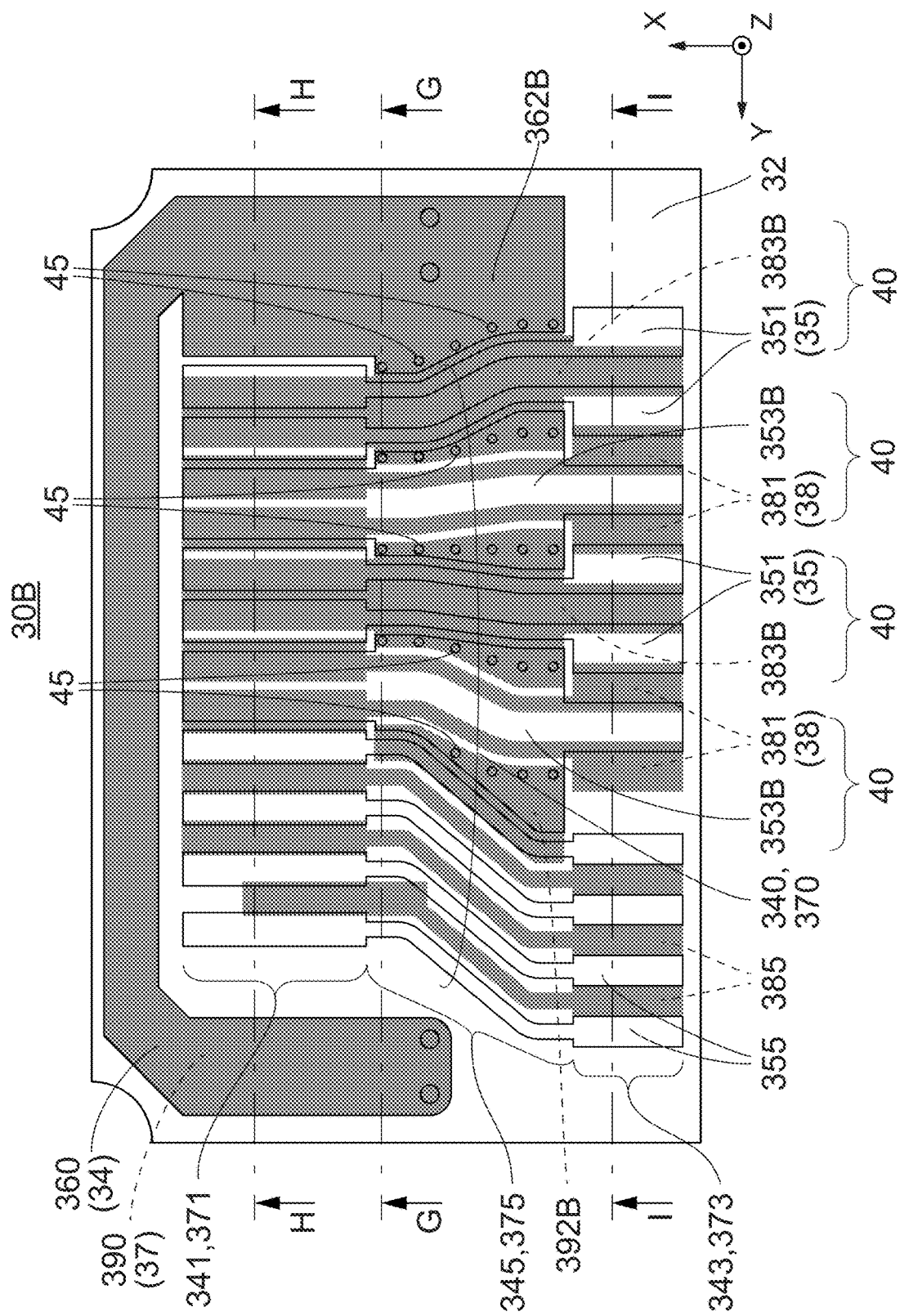
FIG. 17 is another plane view showing the circuit board of FIG. 15. A wiring pattern forming a second wiring layer is represented by a gray tone.
Figure 18:
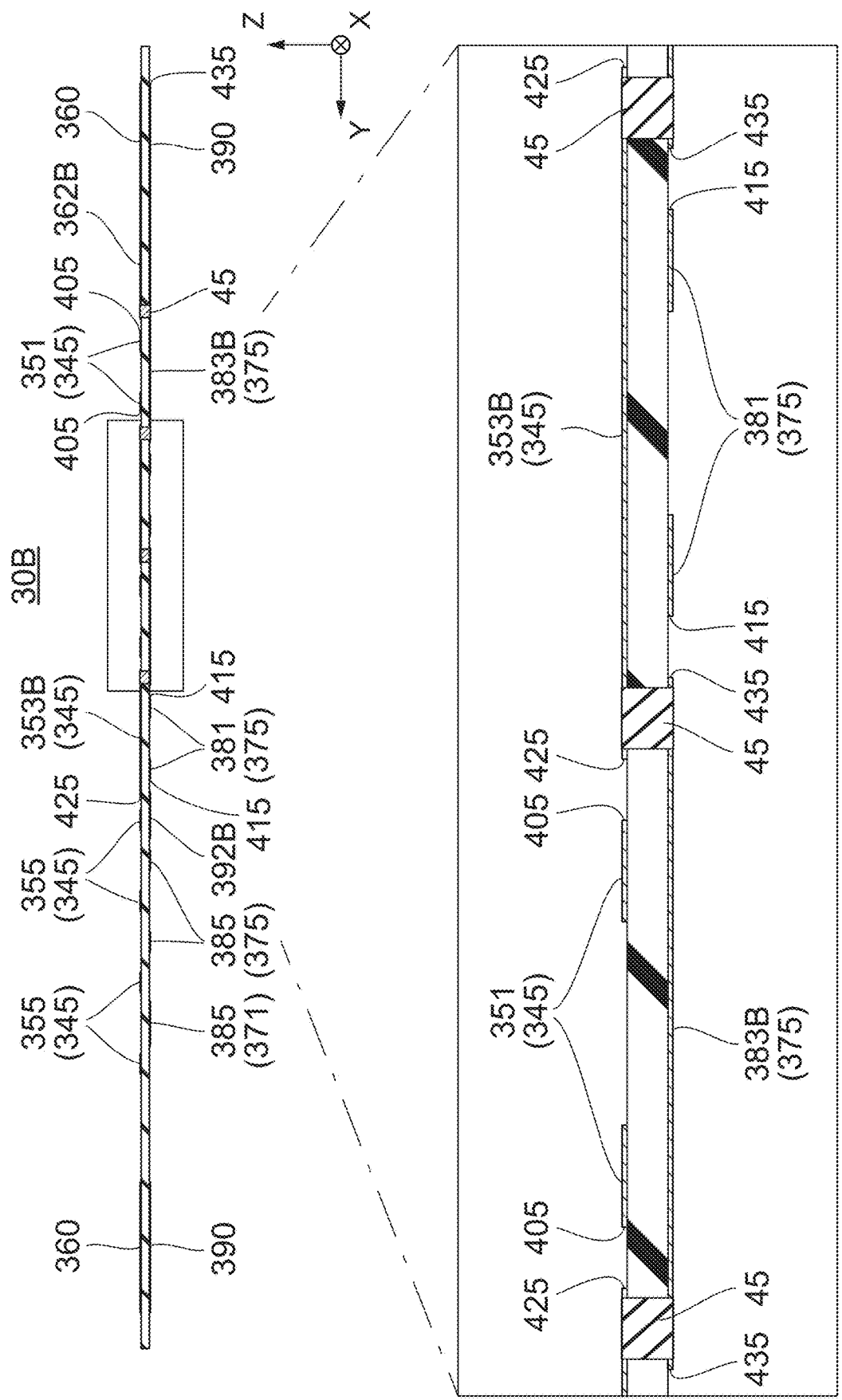
FIG. 18 is a cross-sectional view showing the circuit board of FIG. 17, taken along line G-G. A part of the circuit board is illustrated in an enlarged fashion. Two high speed signal transmission paths located inward in the pitch direction are included in the part illustrated in the enlarged fashion.
Figure 19:
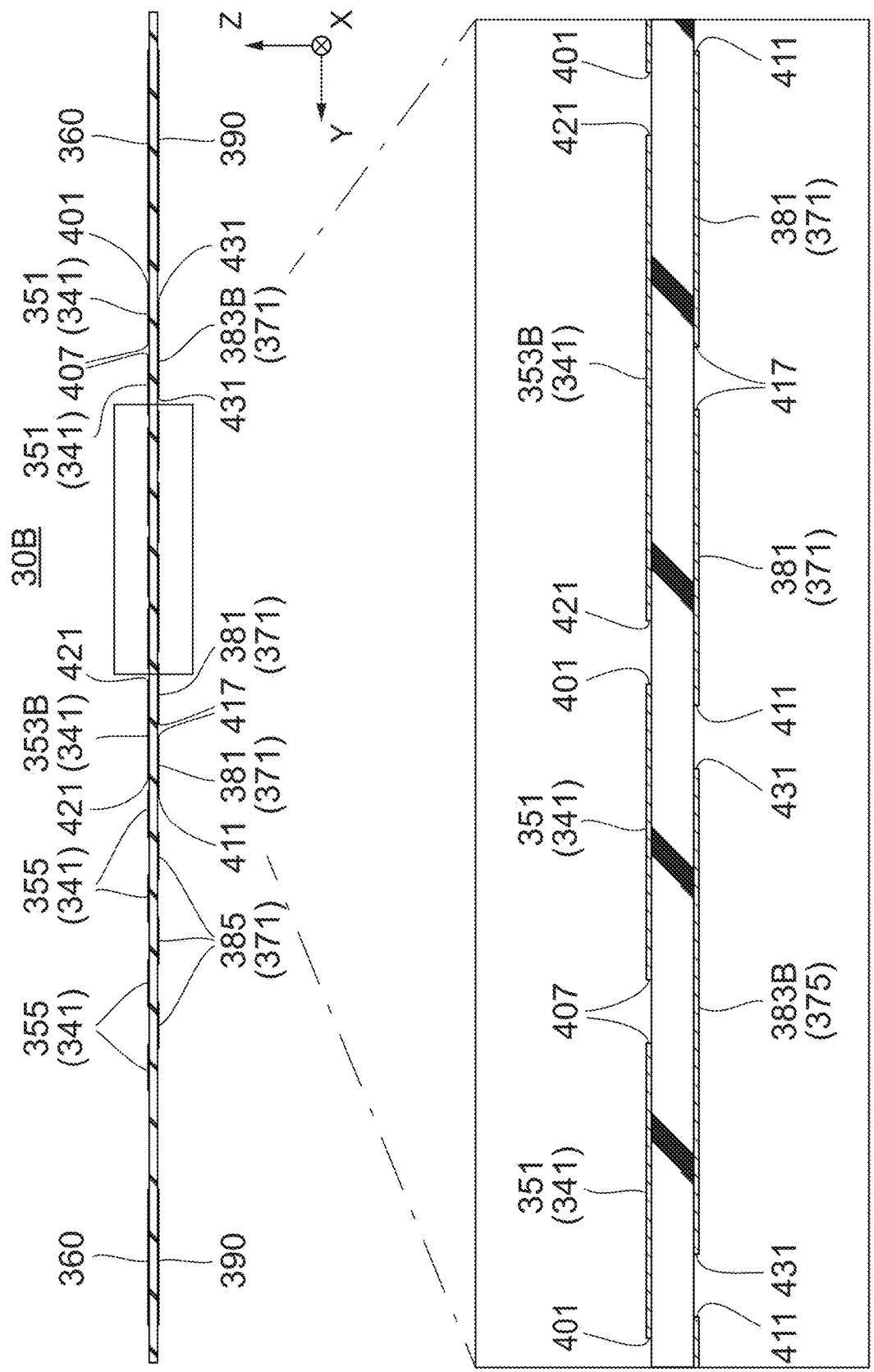
FIG. 19 is a cross-sectional view showing the circuit board of FIG. 17, taken along line H-H. A part of the circuit board is illustrated in an enlarged fashion. The two high speed signal transmission paths located inward in the pitch direction are included in the part illustrated in the enlarged fashion.
Figure 20:
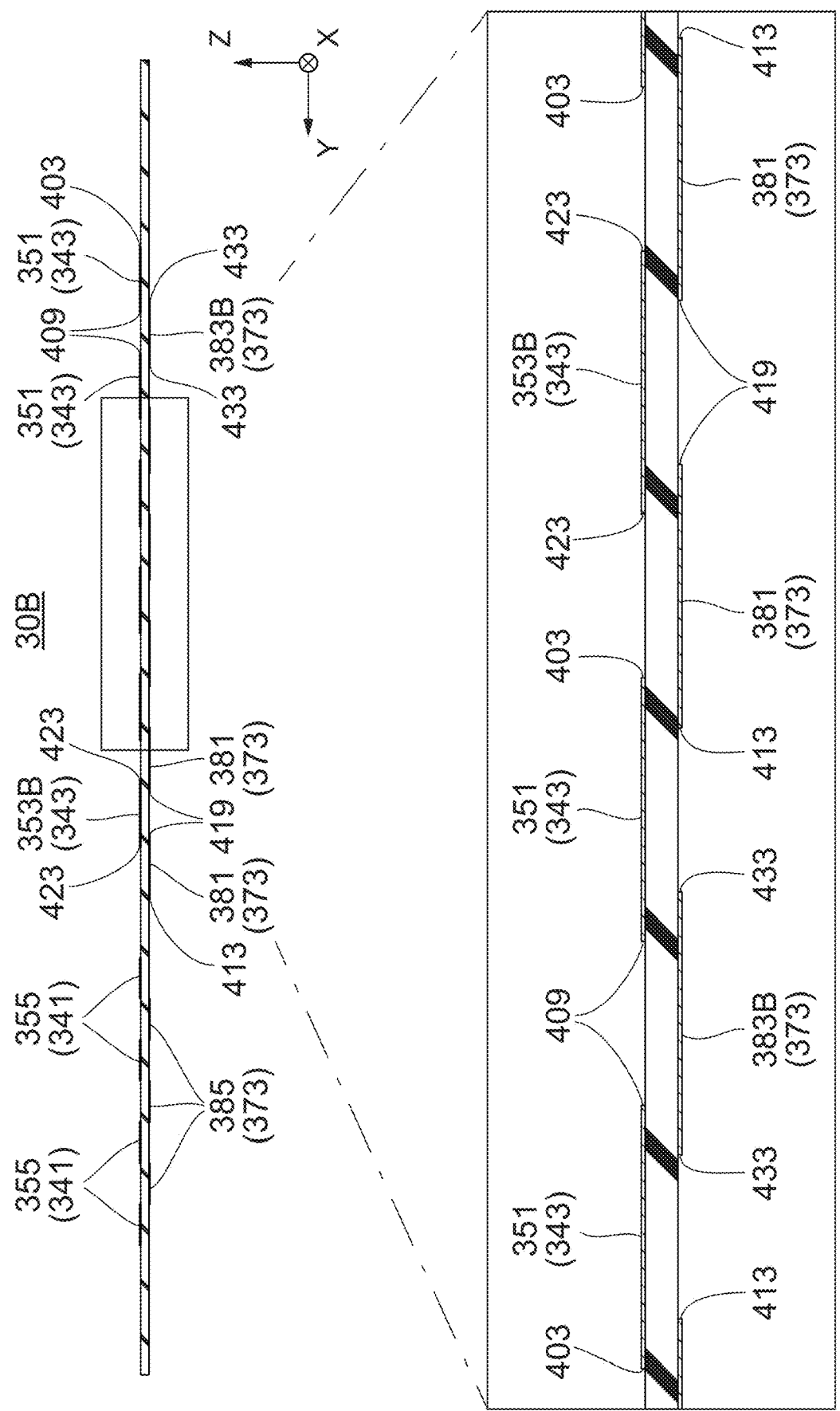
FIG. 20 is a cross-sectional view showing the circuit board of FIG. 17, taken along line I-I. A part of the circuit board is illustrated in an enlarged fashion. The two high speed signal transmission paths located inward in the pitch direction are included in the part illustrated in the enlarged fashion.
Figure 21:
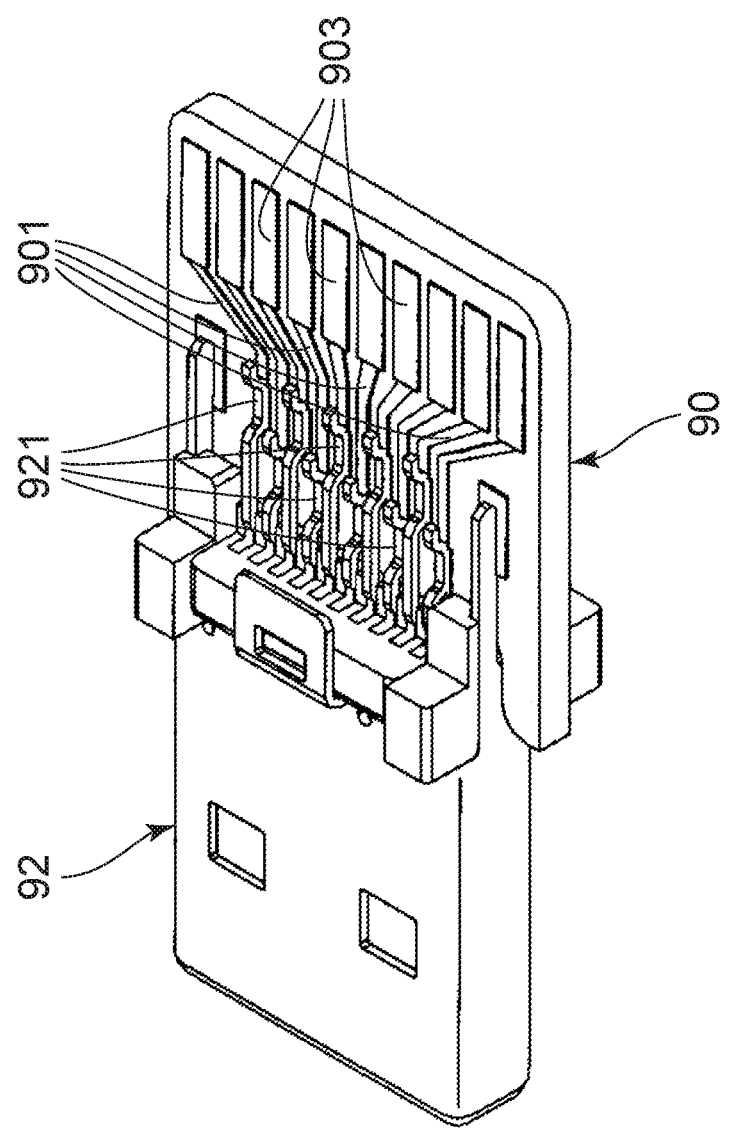
FIG. 21 is a perspective view showing a sub-assembly and a circuit board which are disclosed in Patent document 1.

As understood from FIGS. 17 and 18, the via holes 45 of the first wiring layer 34B and the via holes 45 of the second wiring layer 37B are the same things. In other words, each of the via holes 45 pierces the dielectric layer 32 in the up-down direction and connects the first wiring layer 34B and the second wiring layer 37B to each other. In detail, the first ground trace portion 383B and the second ground trace portion 353B are connected to each other by the via holes 45 at a region where they coincide with each other in the up-down direction. Moreover, the additional ground portion 362 and the first ground trace portion 383B are connected to each other by the via holes 45 at a region where they coincide with each other in the up-down direction. Furthermore, the additional ground portion 392 and the second ground trace portion 353B are connected to each other by the via holes 45 at a region where they coincide with each other in the up-down direction. Since the via holes 45 are provided as just described, a ground function of the circuit board 30B can be enhanced, and signal transmission characteristics can be further improved.

As understood from a comparison between FIGS. 17, 19 and 20 and FIGS. 11, 13 and 14, pattern shapes of the connection portions 341 and 371 and the wire connection portions 343 and 373 of the circuit board 30B are same as those of the circuit board 30A.

Although the specific explanation about the present invention is made above referring to the embodiments, the present invention is not limited thereto. For example, although the circuit board 30 (30A, 30B) is a two-layer substrate which is provided with the first wiring layer 34 (34A, 34B) and the second wiring layer 37 (37A, 37B) in the embodiment mentioned above, a circuit board of the present invention may be formed as a four-layer substrate having a pair of ground layers which are further provided outward of the two-layer substrate in the up-down direction. In that case, the ground layers may be formed on dielectric layers, such as prepregs, respectively, and may be stacked on upper and lower sides of the circuit board 30 (30A, 30B).

This application is based on and claims priority under 35 U.S.C. § 119 to Japanese Patent Application No. JP2018-227513 filed Dec. 4, 2018, the contents of which are incorporated herein in their entirety by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST 10 cable harness
20 connector
22 terminal
24 fixed portion
30, 30A, 30B circuit board
32 dielectric layer
34, 34A, 34B first wiring layer (first layer)
340 trace portion
341 connection portion
343 wire connection portion
345 line portion
35 first differential pair
351 first signal trace portion 353, 353A, 353B second ground trace portion
355 third signal trace portion
360 fixing portion
362, 362B additional ground portion
37, 37A, 37B second wiring layer (second layer)
370 trace portion
371 connection portion
373 wire connection portion
375 line portion
38 second differential pair
381 second signal trace portion
383, 383A, 383B first ground trace portion
385 fourth signal trace portion
390 fixing portion
392, 392B additional ground portion
40 high speed signal transmission path (transmission path)
401, 403, 405, 411, 413, 415 outer edge
407, 409, 417, 419 inner edge
421, 423, 425, 431, 433, 435 edge (both edges)
45 via hole
50 cable
52 coated electric wire
60 hood

The invention claimed is:

1. A circuit board which is used to connect terminals of a connector to electric wires, wherein:
the circuit board comprises a first layer, a second layer and a dielectric layer;
the dielectric layer is interposed between the first layer and the second layer;
each of the first layer and the second layer is provided with a polarity of trace portions;
each of the trace portions has a connection portion to be connected to the terminal, a wire connection portion to be connected to the electric wire and a line portion connecting between the connection portion and the wire connection portion;
the trace portions of the first layer include two first signal trace portions and a second ground trace portion, the two first signal wiring portions forming a first differential pair;
the first signal trace portions and the second ground trace portion are juxtaposed with each other in a pitch direction;
the trace portions of the second layer include two second signal trace portions and a first ground trace portion, the two second signal wiring portions forming a second differential pair;
the second signal trace portions and the first ground trace portion are juxtaposed with each other in the pitch direction;
in the pitch direction, outer edges of the line portions of the two first signal trace portions are located inward of both edges of the line portion of the first ground trace portion, and outer edges of the line portions of the two second signal trace portions are located inward of both edges of the line portion of the second ground trace portion.

2. The circuit board as recited in claim 1, wherein:
in the pitch direction, each of outer edges of the connection portions of the two first signal trace portions is located outward of both edges of the connection portion of the first ground trace portion at least in part,
in the pitch direction, each of inner edges of the connection portions of the two first signal trace portions is located inward of the both edges of the connection portion of the first ground trace portion;
in the pitch direction, each of outer edges of the connection portions of the two second signal trace portions is located outward of both edges of the connection portion of the second ground trace portion at least in part;
in the pitch direction, each of inner edges of the connection portions of the two second signal trace portions is located inward of the both edges of the connection portion of the second ground trace portion;
in the pitch direction, each of outer edges of the wire connection portions of the two first signal trace portions is located outward of both edges of the wire connection portion of the first ground trace portion at least in part;
in the pitch direction, each of inner edges of the wire connection portions of the two first signal trace portions is located inward of the both edges of the wire connection portion of the first ground trace portion;
in the pitch direction, each of outer edges of the wire connection portions of the two second signal trace portions is located outward of both edges of the wire connection portion of the second ground trace portion at least in part; and
in the pitch direction, each of inner edges of the wire connection portions of the two second signal trace portions is located inward of the both edges of the wire connection portion of the second ground trace portion.

3. The circuit board as recited in claim 1, wherein when viewed along in an up-down direction perpendicular to the pitch direction, the line portion of the first ground trace portion and the line portion of the second ground trace portion overlap with each other.

4. The circuit board as recited in claim 3, wherein the line portion of the first ground trace portion and the line portion of the second ground trace portion are connected to each other through a via hole in a region where the line portion of the first ground trace portion and the line portion of the second ground trace portion overlap with each other.

5. The circuit board as recited in claim 1, wherein:
the circuit board is provided with a plurality of sets of transmission paths;
the two first signal trace portions and the first ground trace portion form one of the transmission paths;
the two second signal trace portions and the second ground trace portion form another one of the transmission paths; and
the plurality of the sets of the transmission paths are arranged, as a whole, to be rotational symmetry about an imaginary line extending in a front-rear direction perpendicular to both of the pitch direction and an up-down direction passing through a middle of the dielectric layer in the up-down direction.

6. A cable harness comprising the circuit board as recited in claim 1, the connector and the electric wires.

* * * * *